United States Patent
Altekar et al.

(10) Patent No.: US 7,161,522 B1
(45) Date of Patent: Jan. 9, 2007

(54) SEVERE ASYMMETRY COMPENSATOR FOR OPTICAL RECORDING PRML READ CHANNEL

(75) Inventors: Shirish A. Altekar, Los Gatos, CA (US); Ting Zhou, Alameda, CA (US); Ju Hi John Hong, San Jose, CA (US); Jorge Licona Nunez, Santa Clara, CA (US); Yan Zhang, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/231,310

(22) Filed: Sep. 20, 2005

(51) Int. Cl.
*H03M 1/12* (2006.01)
(52) U.S. Cl. ................. 341/155; 369/59.22
(58) Field of Classification Search ........ 341/155; 369/53.16, 59.22, 124.1, 112.23, 47.35; 375/341
See application file for complete search history.

(56) References Cited

U.S. PATENT DOCUMENTS

| | | | |
|---|---|---|---|
| 5,914,989 A * | 6/1999 | Thapar et al. ........... | 375/341 |
| 6,937,551 B1 * | 8/2005 | Miyashita et al. ....... | 369/53.16 |
| 2001/0006500 A1 * | 7/2001 | Nakajima et al. ........ | 369/47.35 |
| 2005/0063276 A1 * | 3/2005 | Ogura ..................... | 369/59.22 |
| 2005/0094539 A1 * | 5/2005 | Minemura et al. ...... | 369/112.23 |
| 2005/0180298 A1 * | 8/2005 | Horibe et al. ........... | 369/124.1 |

* cited by examiner

Primary Examiner—Rexford Barnie
Assistant Examiner—Joseph Lauture
(74) Attorney, Agent, or Firm—Christopher P Maiorana PC

(57) ABSTRACT

An apparatus comprising an analog-to-digital converter, a compensation circuit, a partial response equalizer and a non-adaptive Viterbi decoder. The analog-to-digital converter may be configured to convert an input analog signal into a digital signal. The compensation circuit may be configured to generate an output signal by clipping the digital signal. The partial response equalizer circuit may be configured to shape the output signal into a pre-defined target with a delay operator. The decoder may be configured to calculate a minimum error between data in the output signal and other possible data sequences.

17 Claims, 3 Drawing Sheets

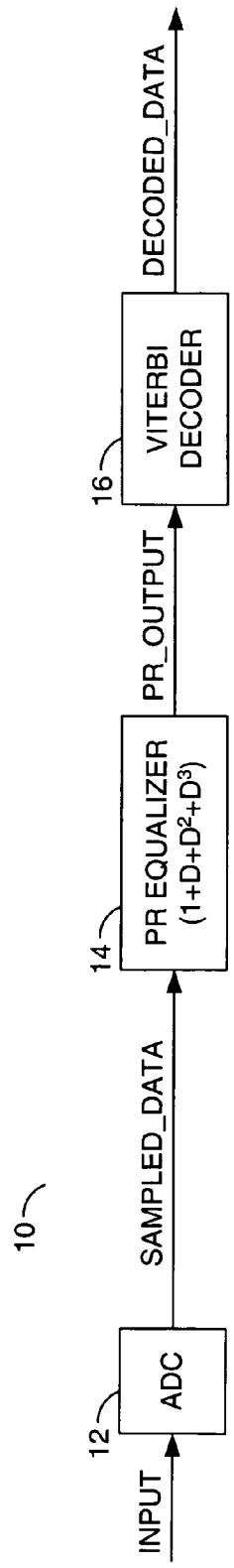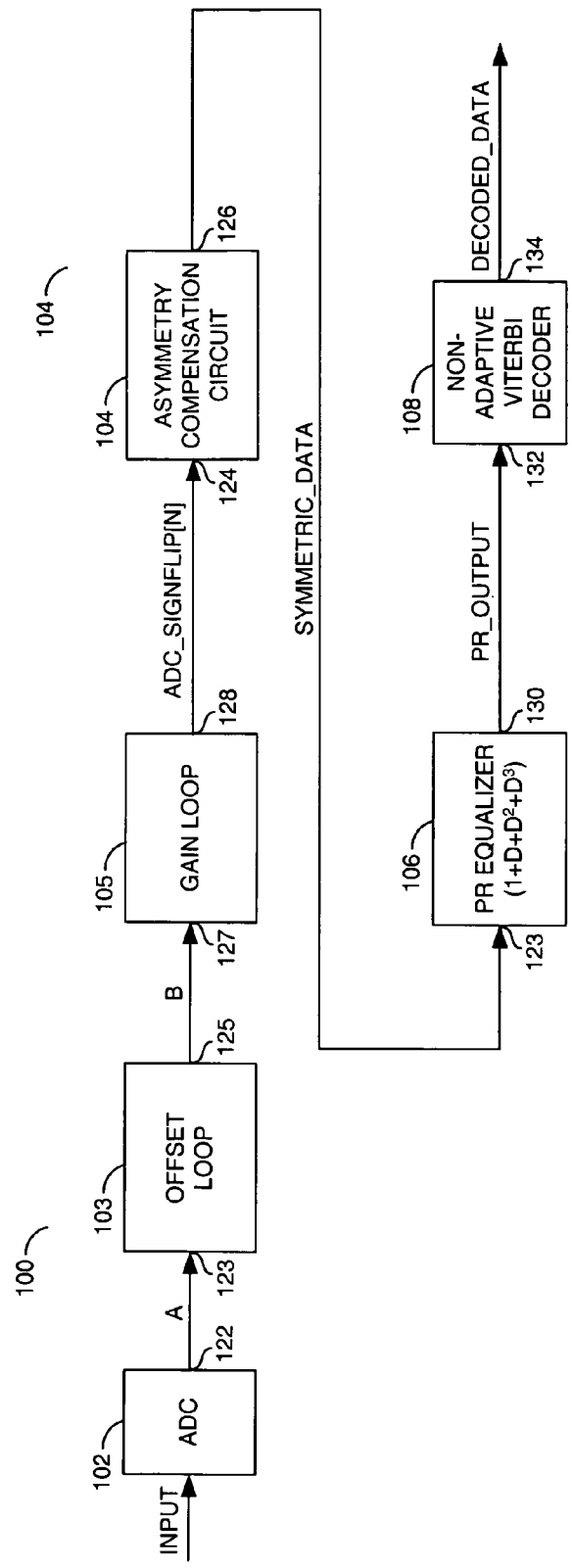

SEVERE ASYMMETRY COMPENSATOR FOR OPTICAL RECORDING PRML READ CHANNEL

FIELD OF THE INVENTION

The present invention relates to data storage generally and, more particularly, to a method and/or apparatus for implementing severe asymmetry compensation for optical recording a Partial Response Maximum Likelihood (PRML) read channel.

BACKGROUND OF THE INVENTION

In conventional PRML read channels, it is important to remove as much non-linearity as possible in the PRML read channel to achieve reliable performance. A common form of non-linearity in optical data storage is asymmetry. Asymmetry is defined as the difference between the mean of the shortest recoding patterns and the mean of the longest recording patterns in Run Length Limited (RLL) code. In the case of DVDs, asymmetry is defined as the difference between the mean of 3T peak–3T bottom and the mean of 14T peak–14T bottom. Asymmetry is also defined as the difference between a top envelope and a bottom envelope after AC-coupling. The asymmetry relies on the center of the AC coupling to be close to the center of 3T. The asymmetry is especially severe in low quality pre-embossed read only media.

Several conventional approaches have been developed to solve the asymmetry problem. In a slicer based read channel, a slicer level feedback from averaging the slicer output is commonly used. A similar implementation of slice level feedback can be found in some PRML read channel designs where active offset feedback loops are used to reduce the effect of asymmetry. In advanced PRML channel designs, more complicated adaptive Viterbi decoders are adopted.

Referring to FIG. 1, a conventional PRML read channel implementing an adaptive Vitberi decoder is shown. The circuit 10 comprises an analog-to-digital converter (ADC) 12, a partial response (PR) equalizer 14 and an adaptive Viterbi decoder 16. The ADC 12 receives analog data on a signal INPUT. The ADC 12 presents a signal SAMPLED_DATA to the PR equalizer 14. The PR equalizer presents a signal PR_OUTPUT to the Viterbi decoder 16. The Viterbi decoder 16 presents a signal DECODED_DATA. The PR equalizer 14 shapes the PRML read channel to a pre-defined target defined as $1+D+D^2+D^3$, for instance, where D is the delay operator. The Viterbi decoder 16 implements a maximum likelihood detection method which compares an incoming sequence of digital data to all possible data sequences to calculate the error distance to each data sequence. After calculating the error distance to each data sequence, the Viterbi decoder 16 detects the path that has the minimum error distance to each data sequence.

When incoming data to the PRML channel has asymmetry, the asymmetry is also counted toward the error distances to paths in the Viterbi decoder 16. The asymmetry reduces the ability for the Viterbi decoder 16 to reject random noise. A conventional PRML read channel also includes an offset loop (not shown) and a gain loop (not shown). The offset loop and the gain loop obtains an optimal offset to generate the least amount of read error for optimizing the performance of the Viterbi decoder 16.

For the PRML read channel, the implementation of an active offset feedback loop in the PRML reader alone is not sufficient to solve the problem in a severe asymmetric case. With a severe asymmetric cure, the offset feedback loop cannot find a balance point sufficient to yield a low enough error rate for both short recorded codes and long recorded codes. The implementation of the adaptive Viterbi decoders in the PRML read channel is too complicated to be implemented in a consumer product.

It would be desirable to provide a method and/or apparatus to reduce and/or eliminate the effects of asymmetry for optical data storage with a PRML read channel.

SUMMARY OF THE INVENTION

The present invention concerns an apparatus comprising an analog-to-digital converter, a compensation circuit, a partial response equalizer and a non-adaptive Viterbi decoder. The analog-to-digital converter may be configured to convert an input analog signal into a digital signal. The compensation circuit may be configured to generate an output signal by clipping the digital signal. The partial response equalizer circuit may be configured to shape the output signal into a pre-defined target with a delay operator. The decoder may be configured to calculate a minimum error between data in the output signal and other possible data sequences.

The objects, features and advantages of the present invention include providing a method and/or apparatus that may (i) reduce the effect of severe asymmetry on a PRML read channel, (ii) eliminate the implementation of adaptive Vitberi decoders in a consumer product, (iii) cut a portion of long recorded codes instead of trying to find a good balance and/or (iv) provide a simple closed-loop asymmetry compensator that clips the positive or negative side of an incoming signal.

BRIEF DESCRIPTION OF THE DRAWINGS

These and other objects, features and advantages of the present invention will be apparent from the following detailed description and the appended claims and drawings in which:

FIG. 1 is a diagram illustrating a conventional PRML read channel;

FIG. 2 is a diagram illustrating a preferred embodiment of the present invention;

DETAILED DESCRIPTION OF THE PREFERRED EMBODIMENTS

Figure 3:
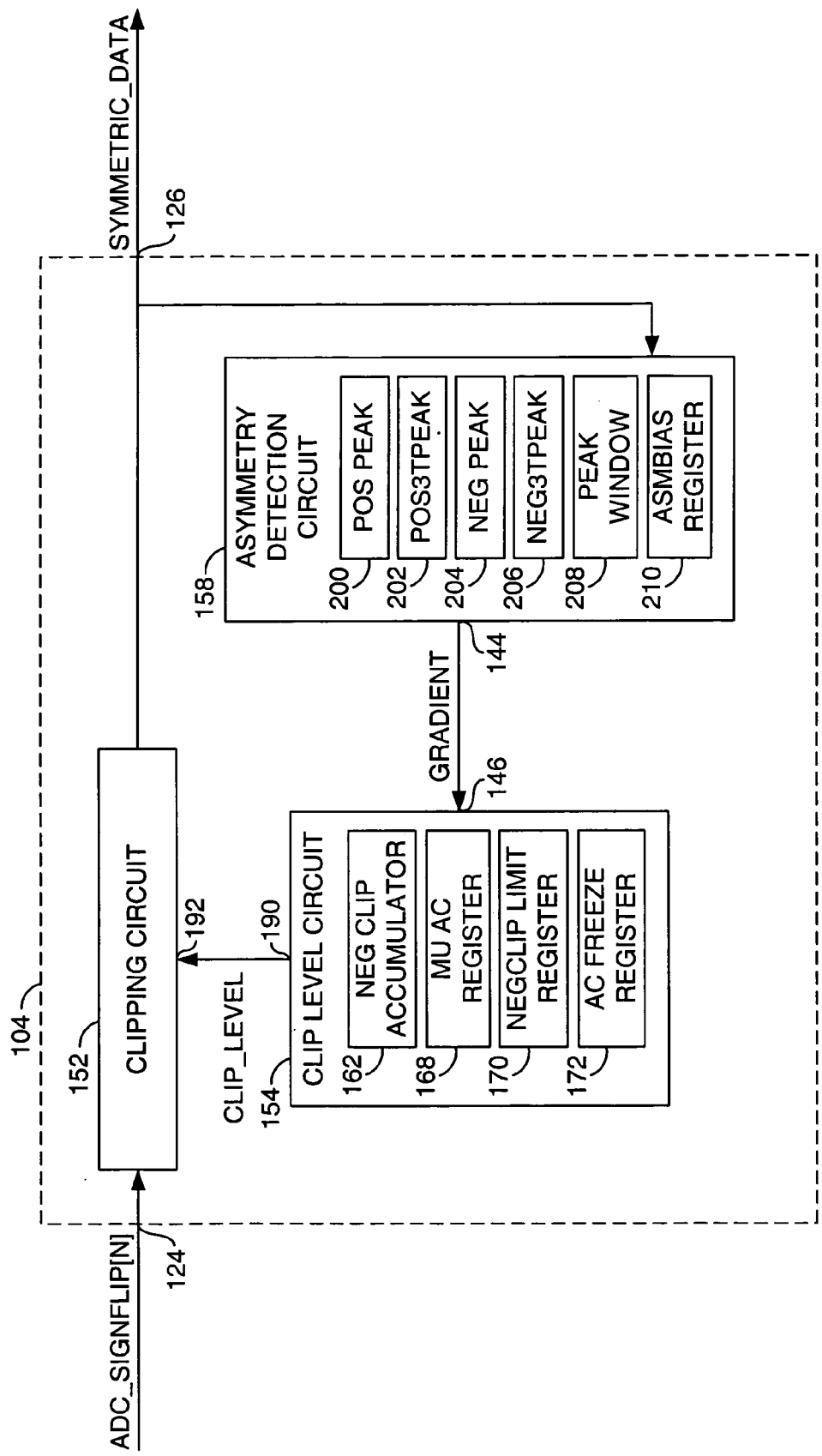
FIG. 3 is a more detailed diagram illustrating an embodiment of the present invention.

Referring to FIG. 2, a block diagram of a system 100 is shown in accordance with a preferred embodiment of the present invention. The system 100 (e.g., a PRML read channel) generally comprises an analog-to-digital converter (ADC) 102, an offset loop 103, an asymmetry compensation circuit 104, a gain loop 105, a PR equalizer 106 and a Viterbi decoder 108. The Viterbi decoder 108 may be implemented as a non-adaptive Viterbi decoder. The ADC 102 may have an input 102 that may receive the signal INPUT. The ADC 102 may have an output 102 that may present a signal (e.g., A) to an input 123 of the offset loop 103. The offset loop 103 may have an output 125 that may present a signal (e.g., B) to an input 127 of the gain loop 105. The gain loop 105 may present a signal (ADC_SIGNFLIP[N]) to an input 124 of the asymmetry compensation circuit 104. The asymmetry compensation circuit 104 may have an output 126 that may present a signal (e.g., SYMMETRIC_DATA) to an input 128 of the PR equalizer 106. The PR equalizer 106 may have an output 130 that may present a signal (e.g., PR_OUTPUT) to an input 132 of the Viterbi decoder 108. The Viterbi decoder 108 may have an output 134 to present a signal (e.g., DECODED_DATA). In one example, the system 100 may clip the negative end of data on the signal ADC_SIGNFLIP[N]. In another example, the system 100 may clip data with proper polarity automatically.

In another embodiment, the asymmetry compensation circuit 104 may be positioned directly after the ADC 102. The asymmetry compensation circuit 104 may receive the signal ADC_SIGNFLIP[N] directly from the ADC. The offset loop 103 and the gain loop 105 may be positioned after the asymmetry compensation circuit 104. The placement of the asymmetry compensation circuit 104 in relation to the offset loop 103 and the gain loop 105 may be varied accordingly to meet the design criteria of a particular implementation.

The improvement provided by the system 100 may be based on a PRML detector which includes the asymmetry compensation circuit 104. The asymmetry compensation circuit 104 may be implemented as an active offset feedback loop.

The present invention may be implemented as a simple close-loop asymmetry compensator that (i) clips the negative side of the signal ADC_SIGN FLIP[N] and/or (ii) clips the positive or negative side of the signal ADC_SIGNFLIP[N] to ensure that the output data on the signal SYMMETRIC_DATA does not have any asymmetry. The system 100 does not normally need to address the zero crossing time error caused by asymmetry. The system 100 reduces the asymmetry effect on the path distance calculation performed by the Vitberi decoder 108.

Referring to FIG. 3, a more detailed diagram of the asymmetry compensation circuit 104 is shown. The circuit 104 may be implemented to clip the negative side of the signal ADC_SIGNFLIP[N]. Generally, the circuit 104 needs a predetermination of the clip direction to clip the signal ADC_SIGNFLIP[N] accordingly. The asymmetry compensation circuit 104 generally comprises a block (or circuit) 152, a block (or circuit) 154, and a block (or circuit) 158. The circuit 152 may be implemented as a clipping circuit. The circuit 154 may be implemented as a clip level circuit. The circuit 158 may be implemented as an asymmetry detection circuit. The circuit 152 may have an input 192 that may receive a signal (e.g., CLIP_LEVEL) from an output 190 of the circuit 154. The circuit 158 may have an output 144 that may present a signal (e.g., GRADIENT) to an input 146 of the circuit 154.

The clip level circuit 154 generally comprises a block (or circuit) 162, a block (or circuit) 168, a block (or circuit) 170, and a block (or circuit) 172. The circuit 162 may be implemented as a negative clip accumulator. The circuit 168 may be implemented as an MU-AC register. The circuit 170 may be implemented as a negative clip limit register. The circuit 172 may be implemented as an AC Freeze register. The asymmetry detection circuit 158 generally comprises a block (or circuit) 200, a block (or circuit) 202, a block (or circuit) 204, a block (or circuit) 206, a block (or circuit) 208, and a block (or circuit) 210. The circuit 200 may be implemented as a positive peak register. The circuit 202 may be implemented as a positive 3T peak register. The circuit 204 may be implemented as a negative peak register. The circuit 206 may be implemented as a negative 3T peak register. The circuit 208 may be implemented as a peak window register. The circuit 210 may be implemented as an ASMBIAS register. The offset counter 160 generally comprises a center ACC (e.g., accumulate) register 220.

In general, the asymmetry compensation circuit 104 assumes that the asymmetry is on the positive side. In one example, a provision is made to allow the negation of the ADC sample on the signal ADC_SIGNFLIP[N] if the asymmetry is on the negative side. The provision generally sets a negate_adc bit (not shown) which is cleared on reset and produces a sign adjusted 10-bit signed adc_signflip value. The negate_adc bit may be set by negating ADC data on the signal ADC_SIGNFLIP[N]. In one example, the circuit 104 may provide clipping of the negative end of data on the signal ADC_SIGNFLIP[N].

The clipping circuit 152 may clip the negative part of the sign adjusted 10-bit signed ADC sample on the signal ADC_SIGNFLIP[N], if the 10-bit signed ADC sample falls below a reference value. The clip level circuit 154 generally stores the reference value. The reference value may be defined by the upper 10-bits of an 18-bit signed value in the negclip accumulator 162. The reference value may be register accessible. The clipping circuit 152 generally provides the signal SYMMETRIC_DATA as a feedback to the asymmetry detection circuit 158.

A 10-bit signed value is stored in each of the positive peak register 200, the positive 3T peak register 202, the negative peak register 204 and the negative 3T peak register 206. Each 10-bit signed value is tracked for a duration of time by a 16-bit unsigned value stored in the peak window register 208. Upon expiration of the duration of time, the 10-bit signed value stored in the positive peak register 200, the positive 3T peak register 202, the negative peak register 204 and the negative 3T peak register 206 may be used to measure the residual asymmetry. The residual asymmetry may be defined by a 13-bit signed ASM variable by the signal ADC_SIGNFLIP[N]. A programmable bias correction may be set through a 10-bit signed value in the asmbias register 210. A measurement of asymmetry may be used to calculate a signal (e.g., gradient) (e.g., a 2-bit signed acgrad) for asymmetry compensation. The programmable bias correction may allow for the circuit 104 to output a predetermined asymmetry instead of a fully symmetric output. The gradient information may be sent to the clip level circuit 154 (e.g., via the signal GRADIENT). The negative clip accumulator 162 may be updated by the signal GRADIENT. If the signal GRADIENT passes a check for saturation on a lower side and an upper side against the data of a 10-bit signed value stored in the negative clip limit register 170. Generally, the lower side may be defined as the highest negative value of the negative clip limit of a signed 10-bit value (e.g., −512). The upper side may be generally defined as the maximum negative value (or limit) of the negative clip limit. The bandwidth of the asymmetry compensation circuit 104 may be set with a 3-bit unsigned value stored in the MU AC register 168. The asymmetry compensation circuit 104 may be frozen by a value stored in the ac-freeze register 172.

Figure 4:
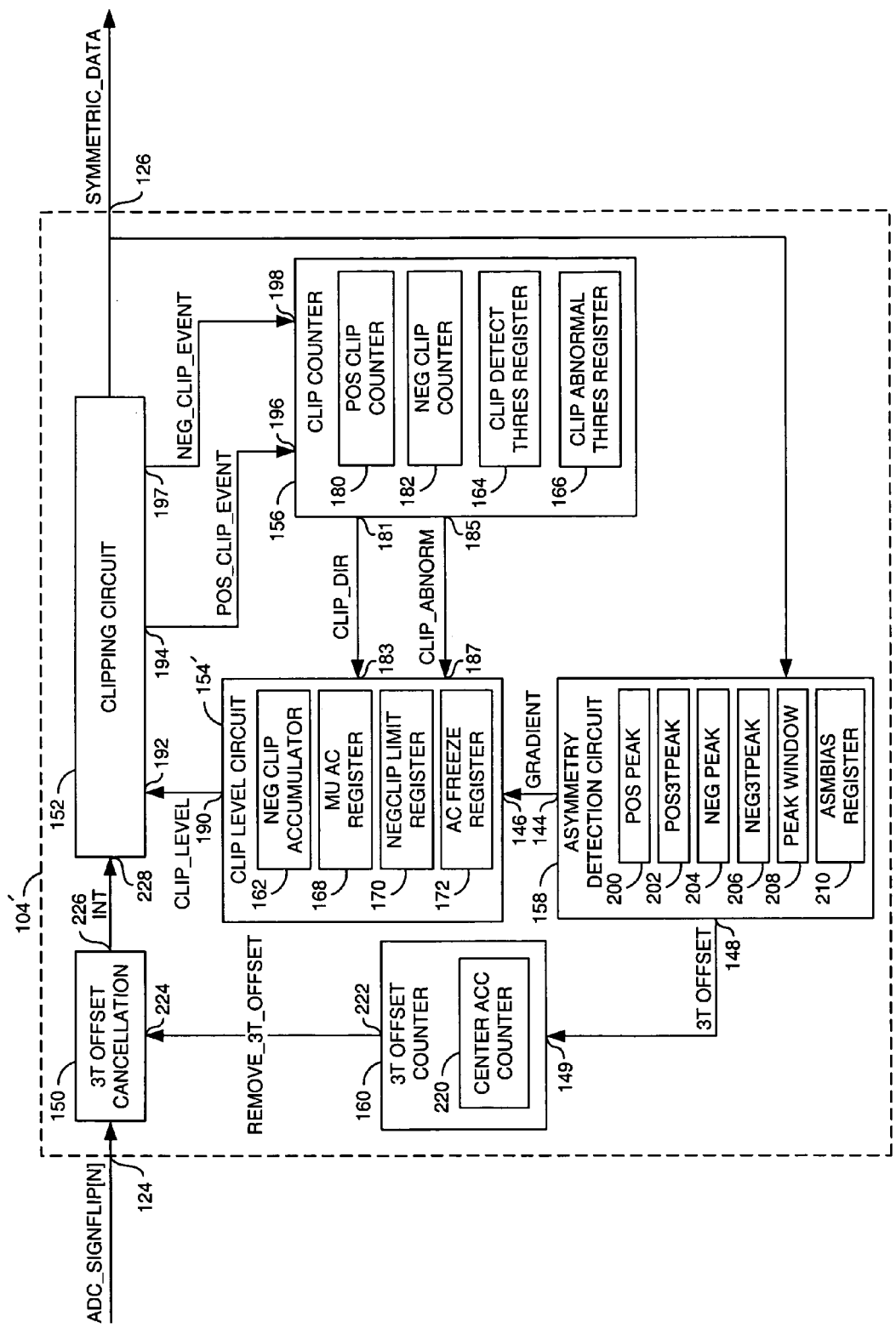
FIG. 4 is a more detailed diagram illustrating a preferred embodiment of the present invention.

Referring to FIG. 4, a more detailed diagram of another embodiment of the asymmetry compensation circuit 104' is shown. The asymmetry compensation circuit 104' may clip data on the signal ADC_SIGNFLIP[N] based on a proper polarity automatically. The asymmetry compensation circuit 104' generally comprises a block (or circuit) 150, the clipping circuit 152, the clip level circuit 154', a block (or circuit) 156, the asymmetry detection circuit 158, and a block (or circuit) 160. The circuit 150 may be implemented as a 3T Offset cancellation circuit. The circuit 156 may be implemented as a clip counter circuit. The circuit 160 may be implemented as a 3T offset counter.

The circuit 150 may have an input 224 that receives a signal (e.g., REMOVE_3T_OFFSET) from an output 222 of the circuit 160. The circuit 150 may have an output 226 that presents a signal (e.g., INT) to an input 228 of the circuit 152. The circuit 152 may have an input 192 that may receive the signal (e.g., CLIP_LEVEL) from an output 190 of the circuit 154'. The circuit 152 may have an output 194 that may present a signal (e.g., POS_CLIP_EVENT) to an input 196 of the circuit 156. The circuit 152 may have an output 197 that may present a signal (e.g., NEG_CLIP_EVENT) to an input 198 of the circuit 156. The circuit 158 may have an output 181 that may present a signal (e.g., CLIP_DIR) to an input 183 of the clip level circuit 154'. The circuit 158 may have an output 185 that may present a signal (e.g., CLIP_ABNORM) to an input 187 of the clip level circuit 154'. The circuit 158 may have an output 148 that presents a signal (e.g., 3T OFFSET) to an input 149 of the circuit 160.

The clip level circuit 154' generally comprises the neg clip accumulator 162, the MU AC register 168, the neg clip limit register 170, and the AC Freeze register 172. The clip counter circuit 156 generally comprises a block (or circuit) 164, a block (or circuit) 166, a block (or circuit) 180 and a block (or circuit) 182. The circuit 164 may be implemented as a clip detect threshold register. The circuit 166 may be implemented as a clip abnormal threshold register. The circuit 180 may be implemented as a positive clip counter 180. The circuit 182 may be implemented as a negative clip counter. In general, the structure of the asymmetry compensation circuit 104' is generally similar to the circuit 104. However, the asymmetry compensation circuit 104' automatically clips the signed ADC samples in either a positive or negative direction. The reference value obtained for the circuit 104 is generally defined as a negative reference value and which may be used for negative clipping. The circuit 104' may use a positive reference value for positive clipping and may be obtained by flipping the sign of the upper 10-bits in the negclip accumulator 162.

The calculation of the signal GRADIENT is generally modified in the asymmetry compensation circuit 104' which takes the signal CLIP_DIR into account. In a first step, the signal GRADIENT is calculated based on an asymmetry value. If the asymmetry measurement is positive, the signal GRADIENT adjusts the signal CLIP_LEVEL closer to the center of the digital samples. Otherwise, the signal GRADIENT drives the signal CLIP_LEVEL away from the center. In a second step, the signal GRADIENT is generally modified based on a clipping status. If the circuit 152 is not performing positive or negative clipping on the signal ADC_SIGNFLIP[N], the signal GRADIENT adjusts the signal CLIP_LEVEL closer to the center of the digital samples on the signal ADC_SIGNFLIP[N]. If the circuit 152 is clipping both on the positive and negative side of the signal ADC_SIGNFLIP[N], the signal GRADIENT adjusts the signal CLIP_LEVEL away from the center of the digital samples on the signal ADC_SIGNFLIP[N]. If neither of above is true in the second step, then, if the signal CLIP_DIR is negative, the signal GRADIENT from the first step is used. Otherwise, an inverted version of the signal GRADIENT from the first step is used.

The positive clip counter 180 and the negative clip counter 182 may each be implemented as respective 9-bit counters. The positive clip counter 180 and the negative clip counter 182 may count up when the signal ADC_SIGNFLIP[N] is larger than the positive reference value or when the signal ADC_SIGNFLIP[N] is smaller than the negative reference value. Both the positive reference and the negative reference values may be calculated by the negclip accumulator 162. The positive clip counter 180 and the negative clip counter 182 may saturate at 511. The values stored in the positive clip counter 180 and in the negative clip counter 182 may be reset at the expiration of the time duration as defined by the value in peak window register 208. The clip counter circuit 156 may set the signal CLIP_DIR to zero when the value in the negative clip counter 182 is larger than the value in the positive clip counter 180. The clip counter circuit 156 may set the signal CLIP_DIR to one when the value in the negative clip counter 182 is smaller than the value in the positive clip counter 180. A positive clip enable register (not shown) may enable the asymmetry compensation circuit 104'.

In general, the clip counter circuit 156 may use the signal CLIP_DIR to provide a status to indicate which side of the ADC samples on the signal ADC_SIGNFLIP[N] is mainly clipped. When the signal CLIP_DIR is zero, negative clipping on the signal ADC_SIGNFLIP[N] may dominate. When the signal CLIP_DIR is a non-zero value, positive clipping on the signal ADC_SIGNFLIP[N] generally dominates. The clip detect threshold register 164 and the clip abnormal threshold register 166 normally each comprise a 3-bit register. The clip detect threshold register 164 may determine when clipping occurs. The clip abnormal threshold register 166 may prevent abnormal clipping from taking place. The clip detect threshold register 164 may be set to a pre-determined value to confirm when a clip has occurred. A clip may be executed or confirmed (i) if the number of clips is greater than a pre-determined value in the clip detect threshold register 164 and (ii) is within the time duration as specified by the peak window 208. The decision to execute clipping (e.g., through the clipping circuit 152) may be updated at the expiration of the time duration as specified in the peak window register 208.

The clip abnormal threshold register 166 may prevent abnormal clipping from occurring if the positive samples and/or the negative samples on the signal ADC_SIGNFLIP[N] are severely clipped. The clip counter circuit 156 may present the signal CLIP_ABNORM to the clip level circuit 154' to indicate an abnormal state. The clip level circuit 154' may control the clipping circuit 152 to stop clipping via the signal CLIP_LEVEL in response to receiving the signal CLIP_ABNORM which indicates an abnormal condition. If both the positive and negative samples are severely clipped, the signal SYMMETRIC_DATA may be symmetric and abnormal. If the counts in each of the positive clip counter 180 and the negative clip counter 182 (e.g., value in the positive clip counter 180 and the negative clip counter 182) are (i) greater than a predetermined value in the clip abnormal threshold register 164 and (ii) within the time duration in the peak window register 208, the clip abnormal threshold register 164 may assert an abnormal state. In general, a significant amount of clipping on both the positive and negative side may cause the entire PRML read channel 100 to crash.

The center ACC counter 220 generally comprises a 10-bit counter, which may help remove the 3T offset. The center ACC counter 220 may count up when the sum of the contents between the positive 3T peak register 202 and the negative 3T peak 206 produces a positive value. The center ACC counter 220 may count down when the sum of the contents between the positive 3T peak register 202 plus the negative 3T peak register 204 produces a negative value. When the value of the center ACC counter 220 is greater than 3, the value is subtracted from the ADC samples in the signal ADC_SIGN_FLIP[N]. The subtraction generally needs to be saturated. In general, the center ACC counter 220 removes the 3T offset from the signal 3T_OFFSET and generates the signal REMOVE_3T_OFFSET. The signal REMOVE_3T_OFFSET may be centered at zero. In general, 3T may be defined as a minimum discrete run-length pair which is 3 bits long mark (1) and 3 bits long space (0), where T is the period (e.g., for DVDs). The length may be different for other applications (e.g., a Blu-Ray format may use a length of 2T). By reducing or removing the 3T offset, the asymmetry compensated signal (or the signal SYMMETRIC_DATA) may be centered with minimal length pairs. The NEGATE_ADC may be deactivated when the asymmetry compensation circuit 104' is enabled (e.g., via the positive clip enable register).

On reset, the positive peak register 200, the negative peak register 204, the positive clip counter 180, and the negative clip counter 182 may be initialized to 0. The positive 3T peak register 202 may be initialized to 511 the and negative 3T peak register 206 may be initialized to −512.

The following TABLE 1 illustrates the registers and bit size for each register as implemented in the asymmetry compensation circuit 104':

TABLE 1

| REGISTER | R/W | RESET | DESCRIPTION |
| --- | --- | --- | --- |
| PEAK WINDOW [15:0] | r/w | 65535 | Length of peak measurement window. |
| NEGCLIP [9:0] | r/w | −512 | Negative clipping threshold. |
| NEGCLIP LIMIT [9:0] | r/w | 0 | Negative clipping threshold limit. |
| ASM BIAS [9:0] | r/w | 0 | Bias compensation for asymmetry measurement. |
| AC FREEZE | r/w | 1 | Set to freeze asymmetry compensation loop. |
| MU AC [2:0] | r/w | 0 | Sets bandwidth of asymmetry compensation loop. |
| NEGATE_ADC | r/w | 0 | Negates ADC sample if set. |
| POSPEAK [9:0] | r | 0 | Latched value of positive peak. |
| NEGPEAK [9:0] | r | 0 | Latched value of negative peak. |
| POS3TPEAK [9:0] | r | 511 | Latched value of positive 3T peak. |
| NEG3TPEAK [9:0] | r | −512 | Latched value of negative 3T peak. |
| POS CLIP EN | r/w | 0 | Enable the new asymmetry compensation circuit |
| CLIP DETECT THRES | r/w | 3 | Clip detected threshold, $2^{CLIP\_DETECT\_THRES}$ |
| CLIP ABNORMAL THRES | r/w | 5 | Clip abnormal detect threshold, $2^{(CLIP\ ABNORMAL\ THRES + 1)}$ |

The present invention may be targeted generally towards data storage and the communications field. The present invention may be targeted for optical data storage with a PRML read channel. The present invention may be implemented easily and may effectively reduce the effect of severe asymmetry on PRML read channels.

The present invention may provide advantages over conventional solutions which may provide an ultimate solution that may be applicable to next generations of optical drives. The present invention may allow for simple implementation that is sensitive, reliable, has high resolution and may be implemented with a low cost.

The function performed by the present invention may be implemented in hardware, software (firmware) or a combination of hardware and software. The present invention may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

The present invention may be applied for all kind of CD optical discs (e.g., CD-ROM, CD-R, CD-RW, etc.) as well as DVD-ROM, DVD-R, DVD-RW, DVD+R, DVD+RW, DVD-RAM. The present invention may also be applicable to next generation optical discs (e.g., Blue-Ray discs and HD-DVD).

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
an analog-to-digital converter configured to generate a digital signal in response to an analog input signal;
a compensation circuit configured to generate an output signal by clipping said digital signal, wherein said compensation circuit further comprises an accumulate register configured to establish the bandwidth for said apparatus;
a partial response equalizer circuit configured to shape said output signal into a pre-defined target with a delay operator; and
a non-adaptive Viterbi decoder configured to calculate a minimum error between data in said output signal and other possible data sequences.

2. The apparatus according to claim 1, wherein said compensation circuit further comprises a clip level circuit configured to generate a clip level signal in response to said gradient signal, wherein said clip level circuit stores a negative reference value updated by said gradient signal.

3. The apparatus according to claim 2, wherein said compensation circuit further comprises a clipping circuit configured to clip negative samples on said digital signal if said digital signal falls below said negative reference value.

4. The apparatus according to claim 2, wherein said gradient signal is used to update a positive reference value stored in said clip level circuit.

5. The apparatus according to claim 4, wherein said compensation circuit further comprises a clipping circuit configured to (i) clip negative samples on said digital signal if said digital signal falls below said negative reference value and (ii) clip positive samples of said digital signal if said digital signal is greater than said positive reference value.

6. The apparatus according to claim 5, wherein said compensation circuit further comprises (i) a positive clip counter configured to count positive clip events and (ii) a negative clip counter configured to count negative clip events.

7. The apparatus according to claim 6, wherein said compensation circuit further comprises a clip counter configured to (i) set a clip count to a first value if said positive clip events are greater than said negative clip events and (ii) set said clip count to a second value if said negative clip events are greater than said positive clip events.

8. The apparatus according to claim 6, wherein said compensation circuit comprises a clip detect threshold register configured to detect when clipping occurs if (i) the number of clips are greater than a predetermined value stored in said clip detect threshold register and (ii) the number of clips are within a particular time duration.

9. The apparatus according to claim 6, wherein said compensation circuit comprises a clip abnormal threshold register configured to (i) store a predetermined value, (ii) compare said positive clip events and said negative clip events and (iii) assert an abnormal condition to prevent a system crash if said positive clip events and said negative clip events are greater than said predetermined value.

10. The apparatus according to claim 1, wherein said apparatus further comprises:
   an offset loop coupled to said output signal; and
   a gain loop coupled to said offset loop, wherein said compensation circuit is coupled to an output of (i) said offset loop or (ii) said gain loop.

11. The apparatus according to claim 1, wherein said asymmetry detection circuit comprises a positive peak register and a negative peak register.

12. The apparatus according to claim 11, wherein said compensation circuit further comprises a center accumulator counter configured to (i) count up when the sum of the contents between said positive peak register and said negative peak register is a positive value and (ii) subtract the contents in said center accumulator counter from digital samples in said digital signal to remove a offset when said sum is greater than a predetermined value.

13. The apparatus according to claim 1, wherein said apparatus further comprises:
   an offset loop coupled to said digital signal; and
   a gain loop coupled to said offset loop.

14. The apparatus according to claim 1, wherein said compensation circuit further comprises an asymmetry detection circuit configured to generate a gradient signal.

15. A method for asymmetry compensation for optical recording, comprising the steps of:
   A) converting an input analog signal into a digital signal;
   B) automatically clipping said digital signal to produce an output signal;
   C) shaping said output signal into a pre-defined target with a delay operation;
   D) calculating a minimum error between data in said output signal and other possible data with a non-adaptive Viterbi decoder;
   E) generating a gradient signal;
   F) updating a negative reference value with said gradient signal; and
   G) clipping negative samples on said digital signal if said digital signal fall below said negative reference value.

16. The method according to claim 15, further comprising the step of:
   updating a negative reference value and a positive reference value with said gradient signal;
   clipping negative samples on said digital signal if said digital signal falls below said negative reference value; and
   clipping positive samples on said digital signal if said digital signal is greater than said positive reference.

17. An apparatus comprising:
   an analog-to-digital converter configured to generate a digital signal in response to an analog input signal;
   a compensation circuit configured to generate an output signal by clipping said digital signal;
   a partial response equalizer circuit configured to shape said output signal into a pre-defined target with a delay operator; and
   a non-adaptive Viterbi decoder configured to calculate a minimum error between data in said output signal and other possible data sequences, wherein (a) said apparatus further comprises an offset loop coupled to said output signal and a gain loop coupled to said offset loop, and (b) said compensation circuit is coupled to an output of (i) said offset loop or (ii) said gain loop.

* * * * *